United States Patent [19]

Meador et al.

[11] Patent Number: 6,156,479
[45] Date of Patent: *Dec. 5, 2000

[54] THERMOSETTING ANTI-REFECTIVE COATINGS

[75] Inventors: Jim D. Meador, Ballwin; Kelly A. Nowak; Gu Xu, both of Rolla, all of Mo.

[73] Assignee: Brewer Science, Inc., Rolla, Mo.

[ * ] Notice: This patent is subject to a terminal disclaimer.

[21] Appl. No.: 09/273,881

[22] Filed: Mar. 22, 1999

Related U.S. Application Data

[63] Continuation-in-part of application No. 08/940,169, Sep. 30, 1997, Pat. No. 5,919,599.
[51] Int. Cl.$^7$ ..................................................... G03F 7/004
[52] U.S. Cl. ...................................... 430/270.1; 430/271.1
[58] Field of Search ................................. 430/271.1, 278.1

[56] References Cited

U.S. PATENT DOCUMENTS

| | | | |
|---|---|---|---|
| 4,544,691 | 10/1985 | Dexter et al. | 524/99 |
| 5,482,817 | 1/1996 | Dichiara et al. | 430/271.1 |
| 5,693,691 | 12/1997 | Flaim et al. | 523/436 |
| 5,731,385 | 3/1998 | Knors et al. | 525/327.6 |

*Primary Examiner*—Janet Baxter
*Assistant Examiner*—Rosemary Ashton
*Attorney, Agent, or Firm*—Hovey, Williams, Timmons & Collins

[57] ABSTRACT

Anti-reflective coating compositions having improved etch rate, inter alia, are prepared from certain acrylic polymers and copolymers, such as, glycidyl methacrylate reacted with non-polycyclic carboxylic acid dyes and non-polycyclic phenolic dyes, all light absorbing at a wavelength of 193 nm.

27 Claims, 1 Drawing Sheet

THERMOSETTING ANTI-REFECTIVE COATINGS

This is a continuation-in-part of application Ser. No. 08/940,169, filed Sep. 30, 1997 now U.S. Pat. No. 5,919,599.

The U.S. government has a paid-up license in this invention and the right in limited circumstances to require the patent owner to license others on reasonable terms as provided for by the terms of contract no. DASG60-98-M-0102 awarded by the United States Department of Defense.

BACKGROUND OF INVENTION

1. Field of Invention

The present invention relates to bottom layer, thermosetting anti-reflective coating compositions for use in multilayer photoresist systems, particularly to those having improved etch rates, improved conformality, and improved optical density at 193 nm wavelength exposure.

2. Background of the Prior Art

Bottom layer anti-reflective coating compositions for use in multilayer photoresist systems have traditionally contained high molecular weight thermoplastic binders such as polysulfones, polyurea sulfones, and poly (vinylpyridine) with high insolubility in photoresist solvents, which has also been referred to as "high differential solubility". These binders serve to inhibit intermixing of the anti-reflective composition with the top layer photoresist. Such thermoplastic binders often require strongly polar solvents such as N-methylpyrrolidone, Y-butyrolactone, and tetrahydrofurfuryl alcohol, which are hygroscopic, have high surface tensions, and exhibit low volatility. While such solvents may be beneficial to "differential solubility", they also lead to a variety of film defects such as dimpling, dewetting, voiding, bubbling, and thickness variations, because of their low volatility.

There is a present trend to reduce the feature size of semiconductor circuitry. As the feature size approaches sub-0.30 micron dimensions, the aforementioned disadvantages of thermoplastic anti-reflective coatings, as well as the drawbacks described in U.S. Pat. Nos. 5,234,990, 5,401,614, 5,482,817, 5,554,485 and European patent application no. 95480087.6, incorporated herein by reference, become increasingly problematic. The most notable problem is that their so-called resistance to intermixing with photoresists becomes less and less complete. Accordingly, slight intermixing always occurs, producing small but discernible distortions at the bottom of resist features. Because the feature sizes are so small, even these small distortions become unacceptable for producing good quality, practical devices.

In order to overcome these drawbacks, there has arisen a need to develop binders, for anti-reflective coatings, from thermosetting, rather than thermoplastic, polymers. The thermosetting polymers would thermally cure sufficiently to be immiscible in photoresist solvents, yet be coatable from faster drying solvents. Thus solvent resistance and coating quality could both be improved. U.S. Pat. No. 5,693,691, entitled "Thermosetting Anti-Reflective Coatings Compositions", and our co-pending application Ser. No. 08/692,714, entitled "Method for Making Multilayer Resist Structures with Thermosetting Anti-Reflective Coatings" herein incorporated by reference, describe the development of thermosetting anti-reflective coatings and disclose novel improvements in composition and methods. The anti-reflective coatings described therein are comprised principally of an oligomeric, hydroxyl-functional resin, an aminoplast crosslinking agent, a protonic acid catalyst, and an appropriate solvent vehicle, wherein the hydroxyl-functional resin is the reaction product of a phenolic or carboxylic acid dye with a low molecular weight epoxy resin having an epoxy functionality of 3 to 10. The coatings are cured by baking for 30 to 120 seconds at temperatures above 150° C. As taught in U.S. Pat. No. 5,693,691, these compositions, which are soluble in more volatile organic solvents are improvements over the prior art since they offer (1) high optical density in ultra thin films (<2000 Å); (2) virtually no intermixing with photoresists; (3) storage stability in catalyzed form; and (4) commercially feasible synthesis techniques for linking chromophores to an oligomeric resin matrix.

Although the above-described dye-attached thermosetting anti-reflective coatings derived from low molecular weight epoxy resins provide many unexpected benefits, they too have drawbacks. One such drawback occurs upon plasma etching images into the anti-reflective coating layer. For example, in U.S. Pat. No. 5,693,691 (see Example 1), oxygen plasma etching proceeds at rates no faster than about 1.25 times that of prior art thermoplastic resins, such as the polyarylethersulfone anti-reflective coating described in U.S. Pat. No. 5,234,990. Since the anti-reflective coating layer thickness is typically 0.05–0.10 microns, a significant negative etch bias may be observed at resist feature sizes below 0.30 microns unless the plasma etch process is highly anisotropic.

Another limitation of dye-attached thermosetting anti-reflective coatings derived from low functionality epoxy resins is their tendency to planarize substrate topography rather than deposit conformally over surface features. The lack of conformality leads to even greater etch biasing of the photoresist since overetching must be applied to remove the anti-reflective coating from trench structures where it tends to build up during the coating and baking processes.

European patent application no. 94305124.3 discloses thermosetting anti-reflective coatings for deep U.V. exposure which comprise at least one compound (typically a polymer or oligomer) having one or more glycidyl functions, at least one phenolic anthracene dye, and a solvent capable of dissolving these compounds. However, unlike the anti-reflective coating compositions discussed above, the anthracene dye in the title compositions is not attached to the glycidyl-bearing polymer prior to cure and an aminoplast crosslinking agent is not present in the composition. Consequently, heating for several minutes at high temperatures is required to produce sufficient reaction between the phenolic anthracene dye and the glycidyl-bearing polymer to insolubilize the coating. This long cure cycle reduces wafer throughput and makes the process generally unacceptable to manufacturers. In addition, the preparation of the title anti-reflective coatings, particularly that of the phenolic anthracene dye components, involves many steps, making the coatings too expensive to produce and use on a practical basis.

U.S. Pat. No. 5,597,868 discloses thermosetting anti-reflective coatings for 193 nm photolithography which cure analogously to the deep U.V. coatings described in European patent application no. 94305124.3. A polyphenolic dye such as a novolac resin is combined with an acrylic polymer which has pendant epoxide functionality. Heating the coating results in a thermosetting reaction between the phenolic hydroxyl groups of the dye and the epoxide groups of the polymer. As claimed therein, however, the curing process must proceed for more than 10 minutes at temperatures greater than 170° C. to be effective.

SUMMARY OF THE INVENTION

It is therefore a principal object of the present invention to provide a novel thermosetting anti-reflective coating composition and method of using the same which negates the drawbacks of the prior art.

It is a particular object of this invention to improve the plasma etch rate of aminoplast-cured thermosetting anti-reflective coatings relative to photoresist layers while retaining fast curing speed, high optical density, good solubility in, and coatability from, safe, volatile solvents; high post-cure differential solubility; and reasonable cost.

It is also a particular object of the present invention to improve conformality and feature coverage in comparison to other dye-attached thermosetting anti-reflective coatings.

It is an additional object to provide an optical density, at 193 nm exposing wavelength, higher than prior art optical density for dye-attached anti-reflective coatings which are cured with aminoplast crosslinking agents. Higher optical density permits the use of thinner anti-reflective coating layers, which in turn permits shorter etch times and reduces etch bias.

The improved thermosetting anti-reflective coating composition is comprised principally of 1) the reaction product of an acrylic polymer or copolymer with a non-polycyclic dye, said dye being either a carboxylic acid or a phenolic, which is light absorbing at 193 nm, whereupon the linkage uniting the polymer and dye is a hydroxyl functional moiety; 2) a multi-functional aminoplast (or reactivity equivalent) crosslinking agent; and 3) a protonic acid catalyst, all of which are dissolved in a suitable highly volatile solvent vehicle. The composition is applied onto a semiconductor substrate and then heated typically for 60 seconds to form a crosslinked coating which exhibits high optical density at 193 nm exposing wavelength, fast plasma etching characteristics, high conformality, and excellent compatibility with chemically-amplified photoresists.

DETAILED DESCRIPTION AND PREFERRED EMBODIMENTS

Figure 1:
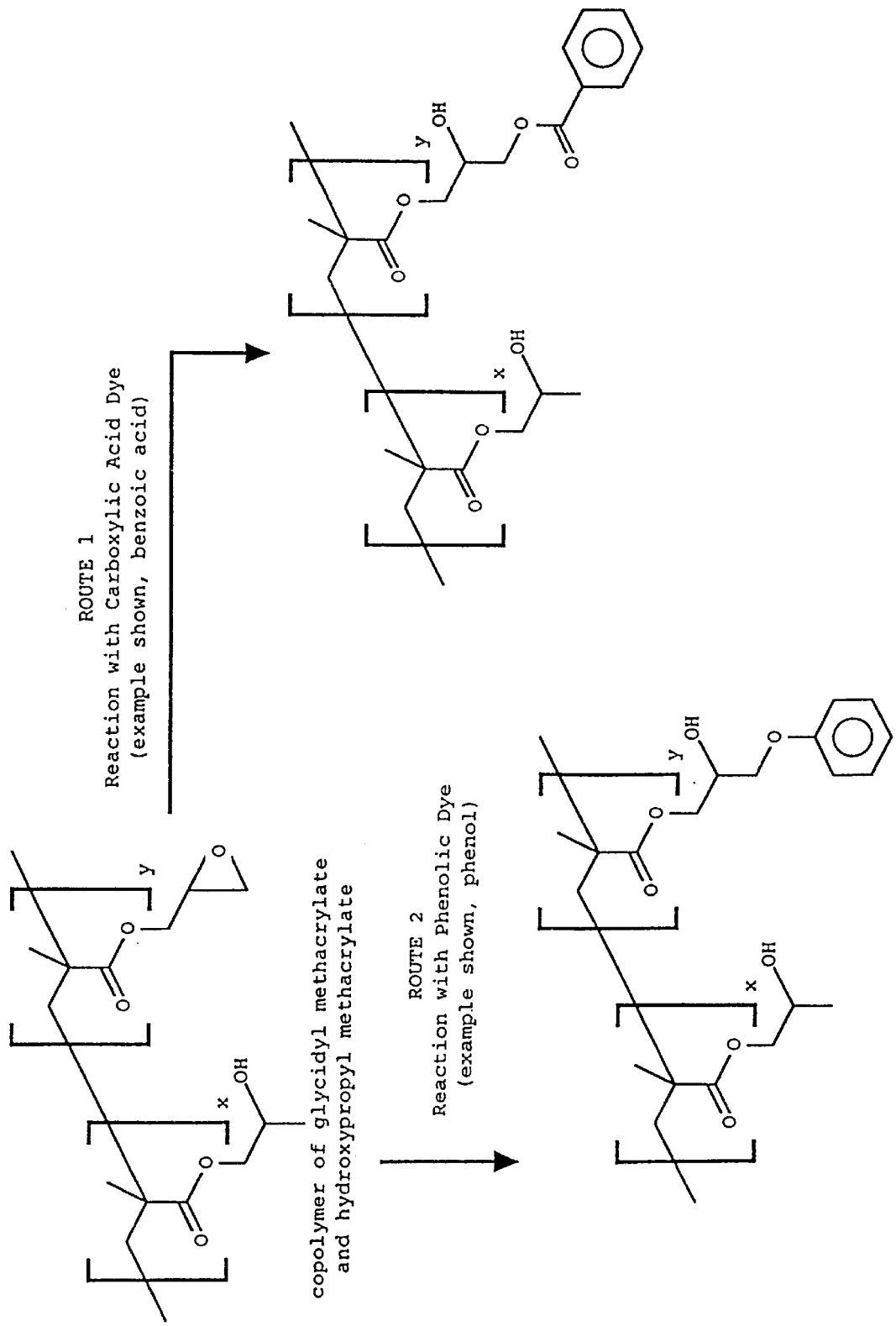
FIG. 1 is a schematic diagram showing the processes for reacting a glycidyl methacrylate-containing acrylic copolymer with a representative carboxylic acid dye or a representative phenolic dye.

The thermosetting anti-reflective coating compositions of the present invention generally comprise:

a. the reaction product of a high molecular weight acrylic polymer or copolymer, preferably glycidyl acrylate or methacrylate, with 193 nm light-absorbing non-polycyclic carboxylic-acid-dyes or 193 nm absorbing non-polycyclic phenolic dyes, wherein the dye is attached to the polymer via in situ reaction of the carboxylic acid group or phenolic group with preferably, the glycidyl group of the polymer to form a hydroxyester or hydroxyether function, respectively;

b. an alkylated aminoplast crosslinking agent preferably melamine, urea, benzoguanamine, or glycoluril or derivatives thereof;

c. a protonic acid catalyst (for curing);

d. a low-to-medium boiling (70° C.–180° C.) alcohol-containing solvent system comprising at least 20% by weight alcohol.

The new compositions provide faster etching characteristics and higher conformality than thermosetting anti-reflective coatings derived from low molecular weight epoxy resins, in addition to offering high optical density. In addition, they provide improved solubility at high dye content over dye-attached prior art acrylic copolymer compositions. This feature derives from the nature of the linkage used to join the dye to the vinyl backbone of the polymer, i.e., the hydroxy ester or hydroxy ether functional moieties. The structure of the linkage in these novel compositions is depicted below using a benzene chromophore as an example.

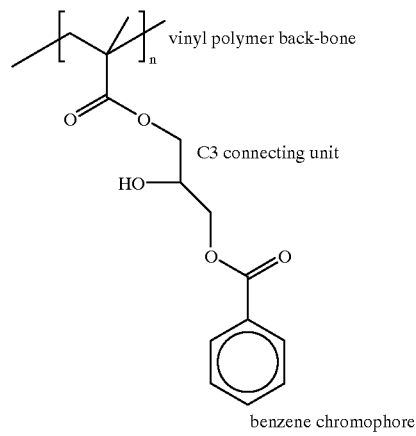

This linkage is preferably comprised of two carboxylic acid esters intervened by a $C_3$ unit. The $C_3$ unit is additionally substituted by a hydroxyl group at the 2 position. We have discovered that the $C_3$ linkage reduces the overall rigidity of the polymer in comparison to the prior art acrylic copolymers, allowing it to remain soluble in preferred coating solvents even when the polymer is fully comprised of benzene-bearing acrylic units. The hydroxyl group on the $C_3$ linkage unit provides additional driving force for solubilization and serves as a reaction site for the aminoplast crosslinking agent, meaning higher crosslink densities and, therefore, greater differential solubility can be achieved than with prior art acrylic systems where crosslinking cannot occur at the chromophore-bearing acrylic units.

Components of Composition

1. Acrylic Polymer/Copolymer

The vinyl polymer or copolymer backbone component of the present invention may comprise a glycidyl acrylate or methacrylate, but preferably glycidyl methacrylate. The glycidyl methacrylate polymer or copolymer to which the dyes are attached can be prepared by well known free radical solution polymerization methods. The preferred number average molecular weight (Mn) range for the copolymer is 2,000–30,000 g/mol; the preferred weight-average molecular weight (Mw) range is 5,000–100,000 g/mol. An especially preferred range for Mn is 10,000–25,000 g/mol; an especially preferred range for Mw is 30,000–70,000 g/mol.

The acrylic polymer may be a homopolymer of glycidyl methacrylate (GMA) or a copolymer of GMA with one or more vinylic comonomers. The acrylic polymer made up of a copolymer of GMA and a vinylic comonomer is preferably either an aminoplast-reactive comonomer, such as 2-hydroxy-3-phenoxypropyl acrylate (HPPA), hydroxy propyl methacrylate (HPM), 2-hydroxyethyl methacrylate (HEMA), 2-hydroxyethyl acrylate (HEA) and mixtures thereof, or a 193 nm light absorbing, non-aminoplast-reactive comonomer such as benzyl methacrylate, styrene, ring-substituted styrene and mixtures thereof. HPPA is especially preferred because in addition to containing a phenoxy function that contributes to 193 nm absorbance, it also contains a hydroxyl reaction site for the aminoplast crosslinking agents which are present in the final coating. If comonomers are used, it is preferred that glycidyl methacrylate should comprise at least 30 mole percent of the monomer units and, more preferably, 40 mole percent, which enhances the optical density achieved via dye attachment to the glycidyl-bearing units. Likewise, a hydroxyl equivalent weight for the polymer less than 545 g/eq is preferred in order to obtain the most improved and effective; crosslink density in the final cured coating.

2. 193 nm Light-absorbing Dyes

The dyes of the present invention are non-polycyclic and either (1) carboxylic acid dyes or (2) phenolic dyes. They do not include anthracenyl or naphthyl moieties. Suitable dyes are monofunctional benzoic acids, arylacetic and aryloxyacetic acid, and conjugated monocarboxylic acids or phenolic dyes which are attached to the acrylic polymer to impart light absorbency to the anti-reflective coating. Also diphenylacetic acids may be used. The intrinsic absorptivity of the dye as well as the concentration of polymer-bound dye should be sufficient to provide an optical density of at least 5.0 per micron film thickness at an exposing wavelength of 193 nm. An optical density of $\geq 9.0$ per micron film thickness at 193 nm is especially desirable for performing sub-0.30 micron photolithography.

Preferred benzoic acid dyes include benzoic acid, anisic acid, 3,5-dinitro-p-toluic acid, 3,5-dinitrobenzoic acid, 3,5-dinitrosalicylic acid, and 4-nitrobenzoic acid. Preferred arylacetic or aryloxyacetic acid dyes include phenylacetic acid, diphenylacetic acid, phenoxyacetic acid, biphenylacetic acid, and their ring-substituted derivatives. Preferred conjugated monocarboxylic acid dyes include cinnamic acid and crotonic acid. Suitable phenolic dyes include phenol, 4-nitrophenol, and 4-hydroxybiphenyl. Of all of these structures, benzoic acid is an especially preferred dye because of its high intrinsic absorptivity at 193 nm exposing wavelength.

It is to be understood that the dyes described above may be chemically modified at various points within their structure, e.g., by nitro substitution on an aromatic ring, while retaining or even improving their useful light-absorbing properties.

3. Acid Catalysts

While p-toluenesulfonic acid is a preferred acid catalyst, other strong protonic acids such as dodecylbenzenesulfonic acid, oxalic acid, phthalic acid, phosphoric acid, and mixtures thereof, may be employed suitably. Acid catalysts with formula weights greater than 80 g/mole are preferred to prevent sublimation when the anti-reflective coating is thermally cured.

Latent protonic acid catalyst may also be used. It may be desirable to have a latent catalyst decompose to form an active protonic catalyst when heated at the curing temperatures used for thermosetting anti-reflective coatings. Examples include sulfonic acid amine salts, e.g. pyridinium tosylate and triethylammonium tosylate, and sulfonic acid esters such as methyl p-toluenesulfonate.

4. Crosslinking Agents

The new anti-reflective coatings are cured on the semiconductor substrate by the application of heat. Heating induces a crosslinking reaction between the hydroxyl substituents on the dye-attached acrylic polymer and the aminoplast crosslinking agent. Such curing mechanisms are well known to include polyester polyols such as those used in industrial coatings and finishes. Suitable aminoplasts include glycoluril-formaldehyde resins, melamine-formaldehyde resins, benzoguanamine-formaldehyde resins, and urea-formaldehyde resins. The use of methylated and/or butylated forms of these resins is highly preferred for obtaining long storage life of from about three to twelve months, under catalyzed conditions. Methylated glycoluril-formaldehyde resins such as ®Cytec Industries POWDER-LINK® 1174 are especially preferred because of their reduced basicity and, therefore, lower tendency to interact chemically with acid-catalyzed photoresists. The aminoplast resin is preferably added to the coating in a proportion which provides 0.20–2.00 equivalents of reactive alkoxymethyl crosslinking function per polymer hydroxyl function. A proportion which provides 0.50–1.00 reactive equivalents per hydroxyl is especially preferred.

5. Solvents and Additives

Suitable solvents for the new anti-reflective coatings include alcohols, esters, glymes, ethers, cyclic ketones, and their admixtures which boil in the range 70–180° C. Especially preferred solvents and co-solvents include 1-methoxy-2-propanol (PGME), 1-methoxy-2-propanol acetate (PGMEA), cyclohexanone, ethyl 3-ethoxy-propionate, and ethyl lactate. Alcohols such as PGME and ethyl lactate should comprise at least 20 weight % of the coating solvent system to lend long storage life.

The coatings may be amended with small amounts (up to 20 weight percent of total solvents) of conventional high boiling anti-reflective coating solvents such as Y-butyrolactone and tetrahydrofurfuryl alcohol to improve the solubility of the dye-attached polymer component, provided the solvents do not cause coating quality or photoresist incompatibility problems. Surfactants such as 3M Company's FLUORAD® FC-171 or FC-430 and adhesion promoters such as glycidoxypropyl triethoxysilane may be added to optimize coating performance.

Method of Preparation

A reaction scheme for preparing the dye-attached acrylic polymer of the present invention is shown in FIG. 1. In the first step, a glycidyl methacrylate-containing polymer or copolymer is reacted in solution with, for example, a benzoic acid, or conjugated aliphatic carboxylic acid dye (Route 1). The reaction opens the epoxy ring of the glycidyl function to form a hydroxyester linkage. The reaction is carried out at about 80–200° C. under nitrogen cover in the presence of a catalyst. While a variety of catalysts may be used, tetraalkylammonium chlorides are preferred. For reasons of economy, the reaction product is preferably left in solution and used as a mother liquor. Similar reaction conditions are employed when a phenolic dye is attached (Route 2). In such instances, however, tetramethylammonium hydroxide or other strong bases are preferred catalysts. Normally, the molar ratio of dye to glycidyl function is adjusted to about 1.0/1.0 unless excess glycidyl function is required for crosslinking.

In a second step, the solution of dye-attached polymer is combined with the crosslinking agent(s), catalyst(s) and other additives to obtain the desired final formulation. Solids level in the anti-reflective coating solution is adjusted typically to about 2.5–10 weight % to achieve the desired 500–2500 Å film thickness.

Preferred Coating Compositions

Preferred proportions for the dye-attached acrylic polymer, aminoplast crosslinking agent, and acid catalyst in the new anti-reflective coatings are shown in the table below:

PREFERRED COMPOSITIONAL RANGES

| PROPORTIONALITY FACTOR | VALUE |
|---|---|
| 1) REACTIVE EQUIVALENTS OF AMINOPLAST TO ACRYLIC POLYMER HYDROXYL | 0.20–2.00 |
| 2) WEIGHT PERCENT ACID CATALYST BASED ON WEIGHT OF AMINOPLAST | 5.00–20.00 |
| 3) WEIGHT PERCENT TOTAL SOLIDS IN COATING | 2.50–10.00 |

When combined in these proportions, the anti-reflective coatings demonstrate excellent resist compatibility, good ambient storage stability, and rapid curing characteristics at bake temperatures between 150–225° C.

Method of Use

The thermosetting polyacrylate anti-reflective coating compositions can be used effectively on all semiconductor substrates including crystalline and polycrystalline silicon, silicon dioxide, silicon (oxy)nitride, aluminum, aluminum/silicon alloys, and tungsten. The anti-reflective coatings are applied by spin coating at 1000–6000 rpm for 30–90 seconds. Spinning speeds of 1500–4000 rpm are especially preferred for obtaining uniform, defect-free coatings on the 6" and 8" substrates commonly used in semiconductor manufacture. The spin coated film is then cured at 120–225° C. for 30–120 seconds on a hot plate or equivalent baking unit. Bake temperatures of 150–225° C. and bake times of 45–90 seconds are especially effective for achieving high differential solubility to the photoresist.

A photoresist is applied over the cured anti-reflective coating by spin coating and then soft baked, exposed, and developed to create the desired masking pattern. An optional post-exposure bake may be applied to the resist prior to development. The resist pattern is then transferred into the anti-reflective coating layer by reactive ion etching (also known as dry etching or plasma etching) using various gases or gas mixtures which are known in the microlithographic art to be effective for etching organic materials, e.g., $O_2$, $Cl_2$, $CF_4$, $HCF_3$, $SF_6$, their admixtures with $N_2$, Ar, and He, etc. After the anti-reflective coating layer has been etched, the semiconductor substrate can be selectively etched, implanted, or deposited on through the pattern formed in the resist and anti-reflective coating. When these steps have been completed, the resist and anti-reflective coating are removed by plasma etching and/or dissolution in liquid stripping chemicals. The stripped substrate is then ready for a new processing cycle.

The following non-limiting examples are illustrative of the invention. Note: Excluding Example 6 and where stated otherwise, all bottom anti-reflective coatings were applied at 4000 rpm/60 sec and cured at 205° C./60 sec.

EXAMPLE 1

A. Addition of Benzoic Acid to Poly(glycidyl methacrylate) [PGM].

A 20.1 wt. % solution of poly(glycidyl methacrylate) was prepared in cyclohexanone by heating the dissolved monomer at ~70° C. for 24 hr in the presence of 1 wt. % azobisisobutyronitrile (AIBN) under a nitrogen blanket. A 1-liter, three-necked flask equipped with magnetic stirring bar, thermometer, nitrogen inlet, and condenser with nitrogen outlet was charged with 214.7 g (301.5 mmol epoxy) of the PGM solution, 279.9 g of cyclohexanone, 36.8 g (301.3 mmol) of benzoic acid, and 1.72 g (7.55 mmol) of benzyltriethylammonium chloride. The resulting mixture was stirred under nitrogen at 104–105.5° C. for 24 hr to form a 15 wt. % polymer mother liquor. The weighed yield of product was 528.8 g, while the theoretical yield was 533.1 g.

B. Precipitation of Mother-Liquor.

About 300 g of the 15.0 wt. % polymer mother liquor was added dropwise to 3 liters of stirred isopropanol. The polymer precipitated as a gum. After standing over a weekend, the gum was collected by filtration and rinsed with 100 ml of fresh isopropanol. This material was redissolved in 300 g of acetone with stirring. The acetone solution was filtered and added dropwise to 3250 ml of stirred deionized water. The mixture was stirred vigorously and then allowed to stand at ambient temperature overnight. Precipitated polymer was collected by filtration and washed with deionized water on the filter. About 36.2 g of white powder was obtained after drying at 39–44.5° C. in vacuo. Gel permeation chromatography gave the following molecular weight parameters for the polymer product: Mw—78,500, Mn—36,600, Mw/Mn—2.14.

C. Preparation of a 193 nm Bottom Anti-Reflective Coating from Polymeric Benzoic Acid Adduct Obtained in (B).

About 4.22 g (16.0 mmol hydroxyl) of the precipitated adduct, 118.8 g 1-methoxy-2-propanol, 29.7 g ethyl lactate, 16.5 g cyclohexanone, 1.72 g (16.0 meq) POWDERLINK® 1174 crosslinking agent (®Cytec Industries, Inc.), and 173 mg of p-toluenesulfonic acid monohydrate were stirred at room temperature giving a homogenous solution containing 3.6% solids. The thermosetting bottom anti-reflective coating was deionized by stirring with 8.6 g of solvent-washed DOWEX® 200H ion exchange beads (®Dow Chemical Company) for 4 hr, strained through four layers of plastic cloth, and then passed through a 0.21 μm end-point filter.

D. 193 nm Bottom Anti-Reflective Coating Properties.

(1) Cured film optical density was 11.6/μm at 193 nm. Negligible stripping was observed with ethyl lactate. The interlayer with APEX-E® deep ultraviolet photoresist (®Shipley Company, Inc.) was only 25 Å (3.54% increase).

(2) Plasma etch selectivities greater than one (1) were obtained for the bottom anti-reflective coating relative to ARC® CD9-1100 polyarylethersulfone anti-reflective coating (®Brewer Science, Inc.). The following selectivity values were obtained for the etchant gas compositions listed below:

| Gas Mixture | Selectivity to CD9-1100 |
|---|---|
| $O_2$-free, fluorinated gas mixture 1 | 1.86 |
| $O_2$-containing gas mixture | 1.51 |
| $O_2$-free, fluorinated gas mixture 2 | 1.51 |

(3) APEX-E® photoresist was patterned over a 703 Å-thick film of the cured bottom anti-reflective coating and then cross-sectioned for scanning electron microscope (SEM) examination. Well-formed 0.35 μm line features, showing minimal curvature at the feature base, were observed.

(4) An experimental 193 nm photoresist was patterned over a 980 Å-thick layer of the cured bottom anti-reflective coating. The resist received a post-application bake at 155° C. and a post-exposure bake at 110–137° C. before being developed in 0.02N aqueous tetramethylammonium hydroxide solution. SEM analysis of the patterned specimen showed that 0.35 μm lines with good profiles were obtained.

Description of Stripping Test

The film thickness and optical absorbance of the cured anti-reflective coating layer are determined on silicon and quartz substrates, respectively. The specimens are then flooded with ethyl lactate, a common photoresist solvent, for 5 seconds followed by spin drying at 5000 rpm for 30 seconds. The wafer is then dried at 100° C. for 30 seconds. The film thickness and optical absorbance are re-determined. If more than a few percent decrease (>5%) in film thickness or optical absorbance results from solvent stripping, the anti-reflective coating is judged to have insufficient solvent resistance for practical usage.

Description of Interlayer Test

This test assesses the potential for intermixing between the photoresist and the anti-reflective coating. For 193 nm anti-reflective coatings, the interlayer test is generally conducted as follows. After coating and curing, the anti-reflective coating thickness is determined by ellipsometry. Next, an 0.8-micron thick layer of deep ultraviolet photoresist such as Shipley APEX-E® is spin coated over the anti-reflective coating. The photoresist is then soft baked on a hot plate at 90° C. for 60 seconds, flood exposed on a contact printer ensuring over-exposure, and post-exposure baked on a hot plate for 90 seconds at 90° C. The specimen is then dip developed in Shipley MICROPOSIT® MF-702 photoresist developer for 60 seconds to clear the exposed photoresist. After a deionized water rinse followed by drying the specimen with nitrogen, the thickness of the anti-reflective coating layer is re-determined. If significant intermixing of the anti-reflective coating and resist has occurred, the anti-reflective coating layer will show an apparent increase in thickness, which may be expressed in Å or as a percentage of the starting anti-reflective coating thickness. Anti-reflective coatings which are highly subject to intermixing will show more than a 10% increase in thickness after resist processing. An interlayer value of less than 5% is considered acceptable.

EXAMPLE 2

A. Addition of Phenol to PGM.

A 250 ml three-necked flask equipped with magnetic stirring bar, thermometer, nitrogen inlet, and condenser with nitrogen outlet was charged with 53.2 g (74.7 mmol epoxy, 10.7 g polymer solids) of 20 wt. % PGM in cyclohexanone solution prepared as in Example 1, 55.8 g cyclohexanone, and 7.05 g (74.9 mmol) of phenol. With the mixture stirring under nitrogen the solution was heated to about 80° C. and 1.95 g (5.35 mmol) of 25 wt. % aqueous tetramethylammonium hydroxide added. The reaction mixture was then heated for 4 hr at 101–124° C. under nitrogen with stirring. After allowing the contents to cool to ambient under nitrogen, 1.20 g (6.3 mmol) of p-toluenesulfonic acid monohydrate was added to neutralize the solution. About 117.6 g of clear mother liquor (14.9 wt. % polymer) was obtained, with theory being 119.2 g.

B. Preparation of 193 nm Bottom Anti-Reflective Coating from the Polymeric Phenol Adduct Obtained in (A).

The anti-reflective coating was prepared by adding 37.5 g (23.5 mmol hydroxyl, 5.58 g polymer solids) of the above mother liquor, 154.7 g of 1-methoxy-2-propanol, 38.7 g of ethyl lactate, 1.26 g (11.7 meq) of POWDERLINK® 1174, and 126 mg of p-toluenesulfonic acid monohydrate to form a 3.0% solids solution. The bottom anti-reflective coating was deionized by stirring for 4 hr with 5 wt. % solvent-washed DOWEX® 200H ion exchange beads. The beads were removed by straining the solution through two layers of plastic cloth. The solution was then passed through a 0.2 μm end-point filter.

C. 193 nm Bottom Anti-Reflective Coating Properties.

(1) Cured film optical density was 14.9/μm at 193 nm. Negligible stripping was observed with ethyl lactate. The interlayer with APEX-E® photoresist was 35 Å.

(2) Plasma selectivities greater than one (1) were obtained for the bottom anti-reflective coating product. The following selectivity values were obtained using the etchant gas compositions listed below:

| Gas Mixture | Selectivity to CD9-1100 |
| --- | --- |
| $O_2$-free, fluorinated gas mixture 1 | 1.61 |
| $O_2$-containing gas mixture | 1.42 |
| $O_2$-free, fluorinated gas mixture 2 | 1.33 |

(3) APEX-E® photoresist was patterned over a 687 Å-thick film of the cured bottom anti-reflective coating. SEM examination showed that well-formed 0.35 μm line features were obtained. A slight curvature was observed at the base of the line features.

EXAMPLES 3

A. Addition of 4-Nitrobenzoic Acid to PGM.

A 20.1 wt. % PGM solution in cyclohexanone prepared as in Example 1 was used in the following reaction. A 250ml three-necked flask equipped with magnetic stirring bar, thermometer, nitrogen inlet, and condenser with nitrogen outlet was charged with 40.4 g (56.7 mmol epoxy, 8.12 g polymer solids) of the PGM solution, 9.48 g (56.7 mmol) of 4-nitrobenzoic acid, 66.8 g cyclohexanone, and 0.65 g (2.85 mmol) benzyltriethylammonium chloride. The reaction mixture was stirred under nitrogen for 24 hr at 95.5–104.5° C. to form a mother liquor. The weighed yield was 115.4 g, while theory was 117.3 g.

B. Preparation of 193 nm Bottom Anti-Reflective Coating from the Polymeric 4-Nitrobenzoic Acid Adduct Obtained in (A).

About 37.5 g (18.1 mmol hydroxyl, 5.62 g polymer solids) of the above mother liquor, 122.0 g 1-methoxy-2-propanol, 30.5 g ethyl lactate, 194 g (18.0 meq) POWDERLINK® 1174, and 195 mg p-toluenesulfonic acid monohydrate were stirred until homogeneous to form a bottom anti-reflective coating. The bottom anti-reflective coating was deionized by stirring for 4 hr with 9.7 g solvent-washed DOWEX® 200H ion exchange beads, roughly filtered, and finally passed through a 0.2 μm end-point filter.

C. 193 nm Bottom Anti-Reflective Coating Properties.

(1) A 700 Å-thick cured film of the bottom anti-reflective coating provided an optical density of 8.7/μm at 193 nm. Ethyl lactate stripping resulted in negligible thickness and absorbance losses.

(2) Plasma etch selectivities were determined relative to the Example 1 bottom anti-reflective coating composition. The values obtained using various etch recipes (see below) were all greater than one (1), indicating that the Example 3 composition possessed faster etching characteristics.

| Gas Mixture | Selectivity to Example 1 Bottom Anti-Reflective Coating |
| --- | --- |
| $O_2$-free, fluorinated gas mixture 1 | 1.23 |
| $O_2$-containing gas mixture | 1.21 |
| $O_2$-free, fluorinated gas mixture 2 | 1.24 |

EXAMPLE 4

A. Addition of trans-Cinnamic Acid to PGM.

A 250 ml three-necked flask equipped with magnetic stirring bar, thermometer, nitrogen inlet, and condenser with nitrogen outlet was charged with 40.4 g (56.7 mmol epoxy, 8.12 g polymer solids) of a 20 wt. % PGM solution in cyclohexanone prepared as in Example 1, 8.40 g (56.7 mmol) trans-cinnamic acid, 60.65 g of cyclohexanone, and 0.65 g (2.85 mmol) of benzyltriethylammonium chloride. T he reaction mixture was stirred under nitrogen for 24 hr at 115–122° C. giving 108.4 g of mother liquor, while theory was 110.1 g.

B. Preparation of a Bottom Anti-Reflective Coating From the Polymeric Trans-Cinnamic Acid Adduct Obtained in (A).

A bottom anti-reflective coating was prepared by mixing 37.5 g (19.3 mmol hydroxyl, 5.62 g polymer solids) of the above mother liquor, 149.5 g of 1-methoxy-2-propanol, 37.3 g of ethyl lactate, 1.04 g (9.67 meq) of POWDERLINK® 1174, and 104 mg of p-toluenesulfonic acid monohydrate. The bottom anti-reflective coating was deionized by stirring with 24.1 g of solvent-washed DOWEX® 200H ion exchange beads for 4 hr, strained through two layers of plastic cloth, and then passed through an end-point filter (final step 0.2 µm).

C. 193 nm Bottom Anti-Reflective Coating Properties.

(1) Cured film optical density was 5.4/µm at 193 nm. Negligible thickness stripping was observed with ethyl lactate, however, absorbance stripping was 5.8%. The interlayer with APEX-E® photoresist was 32 Å (4.91% increase).

(2) Plasma etch selectivities greater than one (1) were obtained for the bottom anti-reflective coating relative to ARC® CD9-1100 anti-reflective coating. The following selectivity values were obtained for the etchant gas compositions listed below:

| Gas Mixture | Selectivity to CD9-1100 |
|---|---|
| O$_2$-free, fluorinated gas mixture 1 | 1.76 |
| O$_2$-containing gas mixture | 1.37 |
| O$_2$-free, fluorinated gas mixture 2 | 1.38 |

(3) APEX-E® photoresist was patterned over a 685 Å-thick film of the cured bottom anti-reflective coating and then cross-sectioned for SEM examination. A slight curvature was observed at the base of the resist features.

EXAMPLE 5

A. Addition of Crotonic Acid to PGM.

A 500 ml three-necked flask equipped with magnetic stirring bar, thermometer, nitrogen inlet, and condenser with nitrogen outlet was charged with 74.5 g (105 mmol epoxy, 14.9 g polymer solids) of PGM in cyclohexanone solution prepared as in Example 1, 9.03 g (104.9 mmol) of crotonic acid, 0.60 g (2.63 mmol) of benzyltriethylammonium chloride, and 76.0 g of cyclohexanone. The resulting solution was stirred under nitrogen for 24 hr at 97–103° C., giving 159.1 g of mother liquor containing 15.0% polymer solids, and 0.659 mmol polymer hydroxyl/g.

B. Preparation of 193 nm Bottom Anti-Reflective Coating From the Polymeric Crotonic Acid Adduct Obtained in (A).

About 40.0 g (6.00 g polymer solids, 26.4 mmol hydroxyl) of the above mother liquor, 174.6 g of 1-methoxy-2-propanol, 43.7 g ethyl lactate, 2.86 g (26.6 meq) of POWDERLINK® 1174, and 288 mg of p-toluenesulfonic acid monohydrate were mixed to form a bottom anti-reflective coating. The bottom anti-reflective coating was deionized by stirring with 13.1 g of solvent-washed DOWEX® 200H ion exchange beads for 4 hr, strained through plastic cloth, and then passed through stacked 10 µm/0.2 µm end-point filters.

C. 193 nm Bottom Anti-Reflective Coating Properties.

A cured, 678 Å-thick film of the bottom anti-reflective coating provided an optical density of 3.93/µm at 193 nm. Ethyl lactate stripping was very low, producing less than 0.3% and 1.9% changes in film thickness and film absorbance, respectively.

EXAMPLE 6

A. Addition of 2-Thiophenecarboxylic Acid to PGM.

About 106.4 g (149.4 meq epoxy, 21.4 g polymer solids) of 20 wt. % PGM in cyclohexanone solution, 143.9 g of cyclohexanone, 19.15 g (149.4 mmol) of 2-thiophenecarboxylic acid, and 0.865 g (3.80 mmol) of benzyltriethylammonium chloride were stirred under a nitrogen blanket for 24 hr at 111–115.5° C. to form a mother liquor. The weighed yield of product was 269.6 g, while theoretical yield was 270.3 g.

B. Preparation of 193 nm Bottom Anti-Reflective Coating from the Polymeric 2-Thiophenecarboxylic Acid Adduct Obtained in (A).

About 200.0 g (30.0 g polymer solids, 110.5 meq hydroxyl) of the above mother liquor, 5.95 g (55.3 meq) of POWDERLINK® 1174, 0.59 g of p-toluenesulfonic acid monohydrate, 325.6 g 1-methoxy-2-propanol, and 511.6 g of ethyl lactate were stirred to give a 3.5% solids bottom anti-reflective coating. The bottom anti-reflective coating was deionized by stirring with 5 wt. % solvent-washed DOWEX® 200H ion exchange beads for 4 hr. It was then strained through two layers of plastic cloth and passed through a 0.1 µm PTFE Whatman end-point filter.

C. 193 nm Bottom Anti-Reflective Coating Properties.

The bottom anti-reflective coating was spin coated at 3000 rpm (60 sec) and then baked at 205° C. (60 sec) under vacuum to obtain a 766 Å-thick film having an optical density of 3.20/um at 193 nm. No ethyl lactate thickness stripping was observed but absorbance stripping was ~2.0%.

EXAMPLE 7

A. Addition of 3,5-Dinitrobenzoic Acid to PGM.

A 250 ml, three-necked flask equipped with magnetic stirring bar, thermometer, nitrogen inlet, and condenser with nitrogen outlet was charged with 53.2 g (74.7 meq epoxy, 10.7 g polymer solids) of 20 wt. % PGM solution, 107.3 g of cyclohexanone, 15.8 g (74.5 mmol) of 3,5-dinitrobenzoic acid, and 0.43 g (1.89 mmol) of benzyltriethylammonium chloride. The mixture was stirred under a nitrogen environment for 24 hr at 100–105° to form a mother liquor.

B. Preparation of 193 nm Bottom Anti-Reflective Coating from the Polymeric 3,5-Dinitrobenzoic Acid Adduct Obtained in (A).

About 40.0 g of the above mother liquor (16.86 mmol polymer hydroxyl, 6.00 g polymer solids, 34.0 g cyclohexanone), 116.8 g 1-methoxy-2-propanol, 29.2 g of ethyl lactate, 1.81 g (16.84 meq) POWDERLINK® 1174, and 181 mg of p-toluenesulfonic acid monohydrate were stirred to homogeneity. The resulting 4.25% solids bottom anti-reflective coating was deionized by stirring with 5 wt. % solvent-washed DOWEX® 200H ion exchange beads for 4 hr and then filtered.

C. 193 nm Bottom Anti-Reflective Coating Properties.

(1) The cured bottom anti-reflective coating film provided an optical density of 5.42/µm at 193 nm. Ethyl lactate stripping produced negligible thickness and film absorbance changes.

(2) The plasma etch selectivity of the bottom anti-reflective coating was determined relative to the Example 1 bottom anti-reflective coating composition. The following selectivity values were obtained for the gas compositions listed below:

| Gas Mixture | Selectivity to Example 1 Bottom Anti-Reflective Coating |
|---|---|
| $O_2$-free, fluorinated gas mixture | 1.73 |
| $O_2$-containing gas mixture | 1.54 |

EXAMPLE 8

A. Addition of 2,4-Dinitrobenzoic Acid to PGM.

About 53.2 g of 20 wt. % PGM in cyclohexanone, 107.3 g of cyclohexanone, 15.8 g (74.5 mmol) of 2,4-dinitrobenzoic acid, and 0.43 g (1.89 mmol) of benzyltriethylammonium chloride were stirred at 98–102.5° C. for one day to form a mother liquor.

B. Preparation of 193 nm Bottom Anti-Reflective Coating from the Polymeric 2,4-Dinitrobenzoic Acid Adduct Obtained in (A).

About 40.01 g of the above mother liquor, 116.9 g of 1-methoxy-2-propanol, 29.4 g of ethyl lactate, 1.81 g (16.8 meq) of POWDERLINK® 1174 and 0.182 g of p-toluenesulfonic acid monohydrate were stirred to form a bottom anti-reflective coating. After deinonizing for 4 hr with 5 wt. % DOWEX® 200H ion exchange beads, the bottom anti-reflective coating was filtered.

C. 193 nm Bottom Anti-Reflective Coating Properties.

(1) Cured film optical density was 5.77/$\mu$m at 193 nm. Ethyl lactate stripping produced negligible film thickness and absorbance losses.

(2) Plasma etch selectivities much greater than one (1) were obtained for the bottom anti-reflective coating relative to ARC® CD9-1100 anti-reflective coating. The etch selectivities obtained using various etchant gas compositions were as follows:

| Gas Mixture | Selectivity to CD9-1100 |
|---|---|
| $O_2$-free, fluorinated gas mixture 1 | 6.32 |
| $O_2$-containing gas mixture | 3.31 |
| $O_2$-free, fluorinated gas mixture 2 | 2.33 |

EXAMPLE 9

A. Preparation of Copolymer of Glycidyl Methacrylate and Hydroxypropyl Methacrylate.

About 29.1 g (201.8 mmol) hydroxypropyl methacrylate (ROCRYL® 410, ®Rohm and Haas Corporation), 19.1 g (134.4 mmol) glycidyl methacrylate, 194.4 g cyclohexanone, and 482.4 mg azobisisobutyronitrile (AIBN) were stirred under a nitrogen blanket at 70–75° C. for 24 hr to form a copolymer solution, wherein the copolymer contained 40 mole % glycidyl methacrylate.

B. Addition of Benzoic Acid to the Above Copolymer.

About 223.8 g of the copolymer solution, 161.7 g of cyclohexanone, 15.1 g (123.6 mmol) benzoic acid, and 710 mg (3.12 mmol) benzyltriethylammonium chloride were stirred under nitrogen at 91.5–109° C. for 25 hr to form a mother liquor.

C. Preparation of 193 nm Bottom Anti-Reflective Coating from the Above Mother Liquor.

About 195.03 g of the above mother liquor, 600.4 g of 1-methoxy-2-propanol, 8.11 g (75.4 meq) POWDERLINK® 1174, and 0.81 g of p-toluenesulfonic acid monohydrate were stirred to form a bottom anti-reflective coating. The solution was deionized by stirring for 4 hr with 5 wt. % solvent-washed DOWEX® 200H ion exchange beads. It was strained through a plastic screen to remove the beads, after which 150.2 g of ethyl lactate was added. The bottom anti-reflective coating was then passed through a 0.2 $\mu$m end-point filter, followed by passing three times through a 0.1 $\mu$m end-point filter.

D. 193 nm Bottom Anti-Reflective Coating Properties.

The cured bottom anti-reflective coating provided an optical density of 7.3/$\mu$m at 193 nm. Ethyl lactate stripping produced negligible changes in film thickness and film absorbance.

EXAMPLE 10

A. Addition of 3,5-Dinitro-p-toluic Acid to PGM.

About 50 g (70.2 meq epoxy, 10.05 g solids) of 20.1 wt. % PGM solution was added to a three-necked flask equipped with magnetic stirring bar, thermometer, nitrogen inlet, and condenser with nitrogen outlet. To the solution was added 106.7 g of cyclohexanone, 15.9 g (70.3 mmol) of 3,5-dinitro-p-toluic acid, and 0.40 g (1.76 mmol) of benzyltriethylammonium chloride. The reaction was stirred under nitrogen for 24 hr at 111–115° C. to form a mother liquor. The weighed yield was 170.0 g, while theory was 173.0 g.

B. Preparation of a 193 nm Bottom Anti-Reflective Coating from the Polymeric 3,5-Dinitro-p-Toluic Acid Obtained in (A).

A 3.50% solids bottom anti-reflective coating was prepared by mixing 50.0 g (20.3 meq hydroxyl, 7.50 g polymer) of the above mother liquor, 138.2 g of 1-methoxy-2-propanol, 59.2 g propylene glycol methyl ether acetate, 1.09 g (10.1 meq) POWDERLINK® 1174, and 111 mg p-toluenesulfonic acid monohydrate. The bottom anti-reflective coating was deionized by stirring with 12.4 g of solvent-washed DOWEX® 650C ion exchange beads for 4 hr. It was strained through two layers of plastic cloth and then passed through a 0.2 $\mu$m end-point filter.

C. 193 nm Bottom Anti-Reflective Coating Properties.

(1) The bottom anti-reflective coating was spin coated at 2500 rpm (60 sec) and cured at 205° C. (60 sec) on a hot plate under vacuum. The cured film provided an optical density of 6.92/$\mu$m at 193 nm. Ethyl lactate stripping was negligible. Storing the bottom anti-reflective coating at ambient and repeating this test one month later revealed that thickness, absorbance, and optical density had changed by less than 8.5% of their initial values.

(2) The plasma etch selectivity of the bottom anti-reflective coating was determined relative to ARC® CD11-1100 polyarylether sulfone anti-reflective coating. It showed an etch selectivity of 2.29:1 when an $O_2$-free, fluorinated gas mixture was used as the etchant gas composition.

EXAMPLE 11

A. Addition of 2,4-Dinitrobenzoic Acid to Poly(benzyl methacrylate-co-glycidyl methacrylate).

A 20.0 wt. % solution of poly(benzyl methacrylate-co-glycidyl methacrylate) containing 35 mole % benzyl methacrylate was prepared in cyclohexanone by copolymerizing the monomers at ~68.5–71.5° C. 5 for 24 hr in the presence of 1 wt. % azobisisobutyronitrile (AIBN). A 500 ml, three-necked flask equipped with magnetic stirring bar, thermometer, nitrogen inlet, and condenser with nitrogen outlet was then charged with 58.1 g (48.6 meq epoxy) of the copolymer solution, 77.4 g of cyclohexanone, 10.3 g (48.6 mmol) of 2,4-dinitrobenzoic acid, and 0.28 g (1.23 mmol) of benzyltriethylammonium chloride. The mixture was stirred for 24 hr at 108.5–111.5° C. under nitrogen to form a mother liquor. Yield was 145.1 g, with theory being 146.1 g.

B. Preparation of a 193 nm Bottom Anti-Reflective Coating from the Polymeric 2,4-Dinitrobenzoic Acid Adduct Obtained in (A).

About 50.0 g (16.65 meq hydroxyl) of the above mother liquor, 0.89 g (8.28 meq) of POWDERLINK® 1174, 89 mg p-toluenesulfonic acid monohydrate, 112.7 g 1-methoxy-2-propanol, and 48.3 g propylene glycol methyl ether acetate were mixed to form a bottom anti-reflective coating, which was then deionized by stirring with 10.6 g of solvent-washed DOWEX® 650C ion exchange beads for 4 hr. The deionized bottom anti-reflective coating was strained through two layers of plastic cloth and passed through a 0.2 μm end-point filter.

C. 193 nm Bottom Anti-Reflective Coating Properties.

The bottom anti-reflective coating was spin coated at 2500 rpm (60 sec) and cured at 205° C. (60 sec) on a hot plate under vacuum. The cured bottom anti-reflective coating film provided an optical density of 10.7/μm at 193 nm. The interlayer with APEX-E® resist was 22 Å (1.98% increase). After storage in a Nalgene bottle for 18 weeks at ambient conditions, the cured film properties (thickness, absorbance, optical density) changed by less than 7.4% of their initial values.

EXAMPLE 12

A. Addition of 3,5-Dinitro-p-Toluic Acid to Poly(2-hydroxy-3-phenoxyproplacrylate-co-glycidyl methacrylate).

A 20.0% solids solution of a copolymer of 2-hydroxy-3-phenoxypropyl acrylate (37.5 mol %) and glycidyl methacrylate (62.5 mol %) in cyclohexanone was prepared by heating the dissolved monomers at 68–75° C. for 24 hr in the presence of 1% azobisisobutyronitrile (AIBN). About 100.0 g of this copolymer (72.0 meq epoxy, 43.2 meq hydroxyl, 20.0 g polymer solids), 16.27 g (71.9 mmol) of 3,5dinitro-p-toluic acid, 0.41 g (1.80 mmol) of benzyltriethylammonium chloride, and 125.1 g of cyclohexanone were then stirred under nitrogen for 24 hr at 111–119° C. to form a mother liquor.

B. Preparation of a 193 nm Bottom Anti-Reflective Coating from the Polymeric 3,5-Dinitro-p-Toluic Acid Adduct Obtained in (A).

A bottom anti-reflective coating was prepared by mixing 75.0 g (11.25 g polymer solids, 35.7 meq hydroxyl) of the above mother liquor, 179.8 g 1-methoxy-2-propanol, 77.1 g propylene glycol methyl ether acetate, 1.93 g (17.95 meq) POWDERLINK® 1174, and 193 mg of p-toluenesulfonic acid monohydrate. The solution was deionized by stirring with 16.7 g of solvent-washed DOWEX® 650C ion exchange beads for 4 hr, strained through two layers of plastic cloth, and then passed through a 0.2 μm end-point filter.

C. 193 nm Bottom Anti-Reflective Coating Properties.

(1) The bottom anti-reflective coating was spin coated at 2500 rpm (60 sec) and cured at 205° C. (60 sec) under vacuum. The film provided an optical density of 9.80/μm at 193 nm. Ethyl lactate stripping was negligible. Allowing the bottom anti-reflective coating to then stand in a Nalgene bottle at ambient conditions for 17 days and recoating showed that film thickness, absorbance, and optical density had changed by less than 7% over the period.

(2) The etch selectivity of the bottom anti-reflective coating (applied at 6.0% solids) was determined relative to ARC® CD11-1100 anti-reflective coating. The following selectivity values were obtained for the etchant gas compositions shown below:

| Gas Mixture | Selectivity to CD11-1100 |
| --- | --- |
| O$_2$-free, fluorinated gas mixture 1 | 2.00 |
| O$_2$-containing gas mixture | 1.77 |
| O$_2$-free, fluorinated gas mixture 2 | 1.57 |

EXAMPLE 13

A. Addition of 3,5-Dinitro-p-Toluic Acid to Poly(2-hydroxy-3-phenoxypropylacrylate-co-glycidyl methacrylate).

The acrylic copolymer and mother liquor were prepared as in Example 12, except the solvent was ethyl lactate.

B. Preparation of a 193 nm Bottom Anti-Reflective Coating Using POWDERLINK® 1174 Cross-Linking Agent.

A bottom anti-reflective coating was prepared by mixing 98.0 g (14.7 g polymer solids, 46.7 meq hydroxyl) of the above mother liquor, 86.1 g of ethyl lactate, 395.2 g of 1-methoxy-2-propanol, 2.51 g (23.35 meq) of POWDERLINK® 1174, and 251 mg of p-toluenesulfonic acid monohydrate. The solution was deionized by stirring for 4 hr with 5 wt. % solvent-washed DOWEX® 650C ion exchange beads. It was then strained through two layers of plastic cloth, passed through a 0.2 μm end-point filter, and finally passed three times through a 0.1 μm end-point filter.

C. 193 nm Bottom Anti-Reflective Coating Properties with POWDERLINK® 1174.

The bottom anti-reflective coating was spun at 2500 rpm (60 sec) and cured at 205° C. (60 sec) under vacuum to obtain a film having an optical density of 9.15/μm at 193 nm. Ethyl lactate stripping was negligible. Coating quality on a six-inch silicon wafer was excellent. The bottom anti-reflective coating was stored in a Nalgene bottle at ambient conditions for 2 weeks and then recoated. Film thickness, absorbance, and optical density had changed by less than 2.3% of their starting values over the two week period.

D. Preparation of a 193 nm Bottom Anti-Reflective Coating Using CYMEL® 303LF Crosslinking Agent.

A bottom anti-reflective coating was prepared by mixing 75.0 g of mother liquor, 40.7 g of ethyl lactate, 243.8 g of 1-methoxy-2-propanol, 2.97 g of CYMEL® 303LF crosslinking agent (®Cytec Industries, Inc.), and 297 mg of p-toluenesulfonic acid monohydrate. It was deionized by stirring with 18.1 g of solvent-washed DOWEX® 650C ion exchange beads for 4 hr, strained through two layers of plastic cloth, and then passed twice through a 0.2 μm end-point filter.

E. 193 nm Bottom Anti-Reflective Coating Properties with CYMEL® 303LF.

The bottom anti-reflective coating was spin coated at 2500 rpm (60 sec) and cured at 205° C. (60 sec) under vacuum, giving a film with an optical density of 10.6 μm at 193 nm. The film showed minimal ethyl lactate stripping

What is claimed is:

1. An improved thermosetting 193 nm anti-reflective composition comprising:

a. the reaction product of a high molecular weight acrylic polymer or copolymer and a non-polycyclic dye, said dye being either a carboxylic acid or a phenolic compound which is light-absorbing at 193 nm, said reaction product having the polymer or copolymer linked to the dye via a hydroxyester moiety in the case of the carboxylic acid dyes or a hydroxyether moiety in the case of the phenolic dyes, which moiety forms in situ during the reaction;

b. an alkylated aminoplast crosslinking agent selected from the group of resins consisting of melamine, urea, benzoguanamine, glycoluril and derivatives thereof;

c. an active or latent protonic acid catalyst for curing; and d. a low-to-medium boiling point alcohol-containing solvent system comprising at least 20% alcohol, whereby said composition has improved plasma etch rate while retaining fast curing speed, high optical density, good solubility in and coatability from safe, volatile solvents, improved conformality and feature coverage but having high differential solubility as between the composition and the photoresist.

2. The composition of claim 1 wherein the hydroxyester or hydroxyether moiety is derived by reaction of the dye with a glycidyl methacrylate unit contained in the acrylic polymer or copolymer.

3. The composition of claim 2 wherein the glycidyl methacrylate containing acrylic polymer or copolymer has a number average molecular weight (Mn) range of from to 2,000 to 30,000 g/mol and a weight average molecular weight (Mw) range of from 5,000 to 100,000 g/mol.

4. The composition of claim 2 wherein the glycidyl methacrylate containing acrylic polymer or copolymer has an Mn of from 10,000 to 25,000 g/mol, and an Mw of from 30,000 to 70,000 g/mol.

5. The composition of claim 2 wherein the acrylic polymer is a homopolymer of glycidyl methacrylate or a copolymer of glycidyl methacrylate with one or more vinylic comonomers.

6. The composition of claim 5 comprising glycidyl methacrylate copolymers containing at least 30 mole percent glycidyl methacrylate to enhance the optical density.

7. The composition of claim 6 having at least 40 mole percent glycidyl methacrylate.

8. The composition of claim 7 wherein the dye is a phenolic dye selected from the group consisting of phenol, 4-nitrophenol, and 4-hydroxybiphenyl.

9. The composition of claim 2 wherein the acrylic polymer is a copolymer of glycidyl methacrylate and a vinylic comonomer can be either a) an aminoplast-reactive comonomers, or b) a 193 nm light absorbing, non-aminoplast-reactive comonomer.

10. The composition of claim 9 wherein the aminoplast-reactive comonomer is selected from the group consisting of 2-hydroxy-3-phenoxypropyl acrylate, hydroxypropyl methacrylate, 2-hydroxyethyl methacrylate, and mixtures thereof.

11. The composition of claim 9 wherein the 193 nm light absorbing, non-aminoplast-reactive comonomer is selected from the group consisting of benzyl methacrylate, styrene, ring-substituted styrene, and mixtures thereof.

12. The composition of claim 1 having hydroxyl equivalent weight for the polymer or copolymer of less than 545 gm/equivalent for improved crosslink density.

13. The composition of claim 1 wherein the light-absorbing dyes have sufficient intrinsic absorptivity and are present in concentrations to effect an optical density of at least 5.0 per micron film thickness at an exposing wavelength of 193 nm.

14. The composition of claim 13 having an optical density of $\geq 9.0$ per micron film thickness at 193 nm for use in performing sub-0.30 micron photolithography.

15. The composition of claim 13 wherein the non-polycyclic carboxylic acid dye is selected from the group consisting of benzoic acid dyes, arylacetic and aryloxyacetic acid dyes, and conjugated monocarboxylic acid dyes.

16. The composition of claim 15 wherein the dye is a benzoic acid dye selected from the group consisting of benzoic acid, anisic acid, 3,5-dinitro-p-toluic acid, 3,5-dinitrobenzoic acid, 3,4-dinitrosalicylic acid, and 4-nitrobenzoic acid.

17. The composition of claim 16 wherein the dye is benzoic acid.

18. The composition of claim 15 wherein the dye is an arylacetic or aryloxyacetic acid selected from the group consisting of phenylacetic acid, diphenylacetic acid, phenoxyacetic acid, biphenylacetic acid, and their ring-substituted derivatives.

19. The composition of claim 15 wherein the dye is a conjugated monocarboxylic acid dye selected from the group consisting of cinnamic acid and crotonic acid.

20. The composition of claim 19 wherein the dye is cinnamic acid.

21. The composition of claim 19 wherein the protonic acid is selected from the group consisting of p-toluenesulfonic acid, dodecylbenzenesulfonic acid, oxalic acid, phthalic acid, and naphthalenesulfonic acid.

22. The composition of claim 1 wherein the strong protonic acid has a formula greater than 80 g/mole to prevent sublimation during thermal cure.

23. The composition of claim 1 wherein the catalyst is a latent protonic acid selected from the group consisting of sulfonic acid amine salts and sulfonic acid esters.

24. The composition of claim 1 wherein the catalyst is a latent protonic acid selected from the group consisting of pyridinium tosylate and triethylammonium tosylate.

25. The composition of claim 1 wherein the aminoplast resins are used in butylated or methylated form.

26. The composition of claim 1 wherein the ratio of reactive equivalents of aminoplast to that of the acrylic polymer or copolymer hydroxy moiety is from 0.20 to 2.00, and the weight percent of acid catalyst based upon the weight of aminoplast ranges from 5 to about 20 weight percent, and the weight percent of total solids in the coating ranges from 2.5 to about 10%.

27. The composition of claim 1 wherein its etch selectivity to novolac and poly(hydroxystyrene) based photoresists is greater than 1.0 under plasma etch conditions in which oxygenated, fluorinated or chlorinated gases or mixtures thereof are used to generate the active etching species.

* * * * *